(12) United States Patent
Haroun

(10) Patent No.: US 6,418,047 B2
(45) Date of Patent: Jul. 9, 2002

(54) SYSTEM AND METHOD FOR STORING DATA IN READ-ONLY MEMORY

(75) Inventor: Baher S. Haroun, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 25 days.

(21) Appl. No.: 09/757,108

(22) Filed: Jan. 8, 2001

Related U.S. Application Data

(60) Provisional application No. 60/175,608, filed on Jan. 11, 2000.

(51) Int. Cl.[7] .............................................. G11C 11/56
(52) U.S. Cl. ..................... 365/168; 365/104; 365/189.01
(58) Field of Search ................................. 365/168, 180, 365/187, 188, 104, 94, 189.01, 210

(56) References Cited

U.S. PATENT DOCUMENTS

| | | | | |
|---|---|---|---|---|
| 4,811,301 A | * | 3/1989 | Houston | 365/203 |
| 5,285,411 A | * | 2/1994 | Yamauchi et al. | 365/189.01 |
| 5,870,326 A | * | 2/1999 | Schuelein | 365/94 |

* cited by examiner

Primary Examiner—David Nelms
Assistant Examiner—Gene N. Auduong
(74) Attorney, Agent, or Firm—W. James Brady; Frederick J. Telecky, Jr.

(57) ABSTRACT

A system for storing data in read-only memory is disclosed that comprises bit level conductors, transistors, and sets of reference level conductors. Each reference level conductor has a reference value. A selected reference level conductor transmits a selected reference value to one of the transistors. The transistor transmits the selected reference value to a selected bit level conductor having a selected bit value. The bit level conductors, the transistors and the reference level conductors store data by encoding data as a combination comprising the selected bit value and the selected reference value. A method for storing data in read-only memory is disclosed. Bit level conductors having bit values, transistors, and sets of reference level conductors having reference values are provided. A selected bit value of a selected bit level conductor and a selected reference value of a selected reference level conductor are selected. Data is encoded by translating the data from a digital form to a combination comprising the selected bit value and the selected reference value. The data is stored by coupling the selected bit level conductor to the selected reference level conductor such that the selected reference level conductor can transmit the selected reference value to the selected bit level conductor.

22 Claims, 2 Drawing Sheets

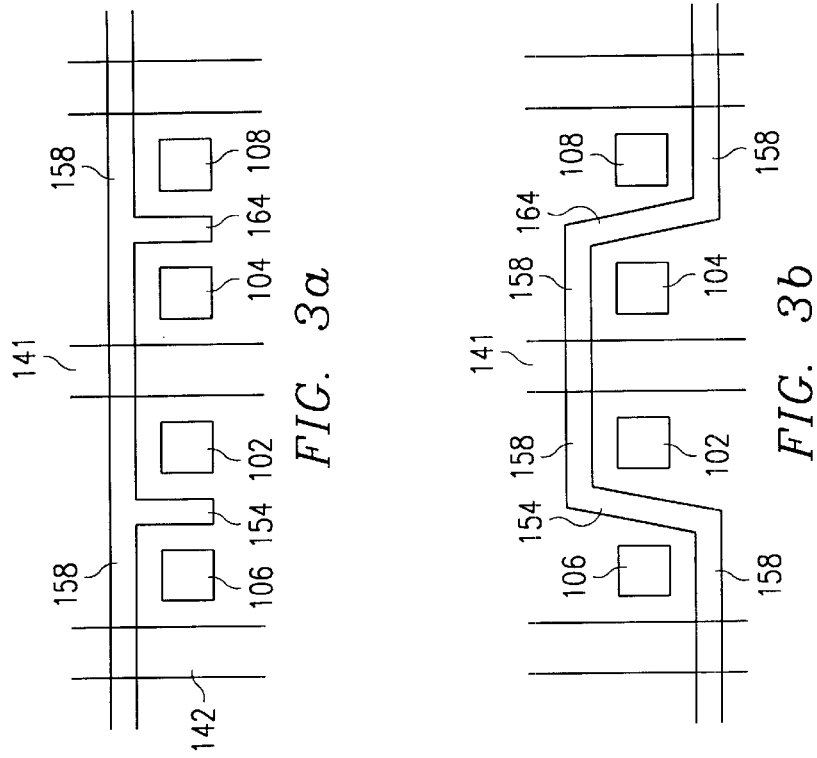
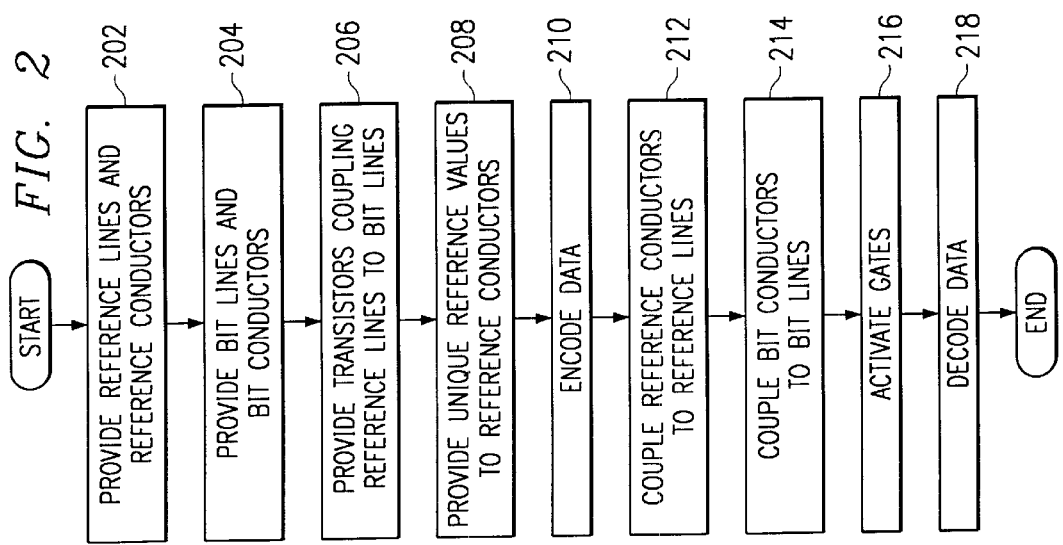

US 6,418,047 B2

SYSTEM AND METHOD FOR STORING DATA IN READ-ONLY MEMORY

This application claims priority under 35 USC §119(e)(1) of provisional application No. 60/175,608 filed Jan. 11, 2000.

TECHNICAL FIELD OF THE INVENTION

This invention relates generally to the field of data storage and more specifically to a system and method for storing data in read-only memory.

BACKGROUND OF THE INVENTION

The rising use of semiconductors in a variety of implementations has led to the increasing demand for more efficient storage of data. Semiconductors are used in a number of products, including computers, automobiles, and household appliances, and are often used to store an increasingly large amount of data in read-only memory (ROM). Moreover, as computational devices become smaller, the space available for storing data has decreased. Known methods for storing data, however, have not been satisfactory in terms of storage efficiency and ease of production.

Data is stored in ROM by encoding values using a pattern of connections on a semiconductor. Known approaches for programming connections include via, metal, gate, and moat programming. Via programming uses vias, couplings from one semiconductor layer to another, to establish connections. Although via programming is relatively easy to produce, it yields a low storage density, represented as the number of storage bits per unit area, compared to other known ROM programming techniques in similar semiconductor processes. Metal programming establishes connections using metal layers, and is also relatively easy to do. Metal programming, however, also yields a low storage density compared to other known ROM programming techniques. Gate programming uses transistors to establish connections. This type of programming allows for storage of relatively large amounts of data per unit area, but results in slow storage and retrieval. Moat programming uses moats formed in the substrate of the semiconductor to establish connection and also allows for the storage of a relatively large amount of data. In moat programming, however, the programation of the connections must be established during the earliest stages of semiconductor production. Since a ROM cannot be programmed until after a customer has submitted a programming request, programming a semiconductor in the earliest stages results in a relatively long period from customer request to delivery of the product.

While these approaches have provided improvements over prior approaches, the challenges in the field of data storage have continued to increase with demands for more and better techniques having greater storing efficiency and production. Therefore, a need has arisen for a new system and method for storing data in read-only memory.

SUMMARY OF THE INVENTION

In accordance with the present invention, a system and method for storing data in read-only memory are provided that substantially eliminate or reduce the disadvantages and problems associated with previously developed systems and methods.

According to one embodiment of the present invention a system for storing data in read-only memory is disclosed that comprises bit level conductors, transistors, and sets of reference level conductors. Each reference level conductor has a reference value. A selected reference level conductor transmits a selected reference value to one of the transistors. The transistor transmits the selected reference value to a selected bit level conductor having a selected bit value. The bit level conductors, the transistors and the reference level conductors store data by encoding data as a combination comprising the selected bit value and the selected reference value.

According to one embodiment of the present invention, a method for storing data in read-only memory is disclosed. Bit level conductors having bit values, transistors, and sets of reference level conductors having reference values are provided. A selected bit value of a selected bit level conductor and a selected reference value of a selected reference level conductor are selected. Data is encoded by translating the data from a digital form to a combination comprising the selected bit value and the selected reference value. The data is stored by coupling the selected bit level conductor to the selected reference level conductor such that the selected reference level conductor can transmit the selected reference value to the selected bit level conductor. The reference value may be transmitted to the bit conductor through a switch, for example, a transistor, in a semiconductor process.

A technical advantage of the present invention is that it uses up to all available or additional conduction layers, such as metal layers, of a semiconductor process to store data. The use of additional layers results in the storage of a large amount of information in a relatively small area. Another technical advantage of the present invention is that the programming of the semiconductor occurs in the later stages of production. By programming at later stages, the present invention allows for faster production of semiconductors from the time of the customer's programming request. Consequently, the present invention allows for the fast production of semiconductors that are able to store a large amount of information.

Other technical advantages are readily apparent to one skilled in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which:

FIG. 2 is a flowchart demonstrating one embodiment of a method that may be used in accordance with the present invention; and FIGS. 3a–3b is a planar view of an exemplary layout identifying stacks, gates, and lines.

DETAILED DESCRIPTION OF THE DRAWINGS

Figure 1:
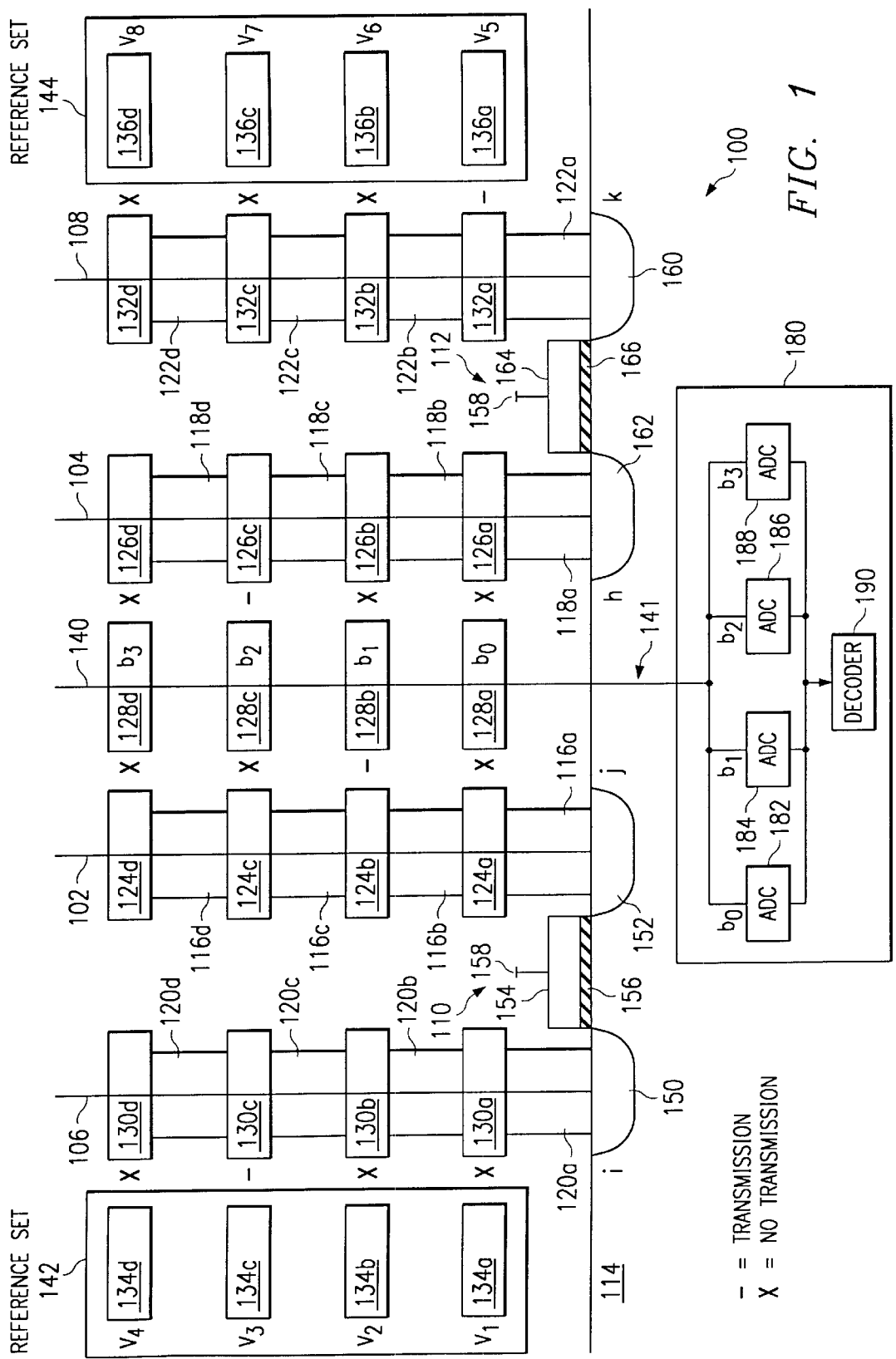
FIG. 1 is a block diagram of one embodiment of a system that may be used in accordance with the present invention.

An embodiment of the present invention and its advantages are best understood by referring to FIGS. 1–3 of the drawings, like numerals being used for like and corresponding parts of the various drawings.

FIG. 1 is a block diagram of one embodiment of a system 100 that may be used in accordance with the present invention. In general, system 100 comprises a multi-layer semiconductor having one or more bit lines 102 and 104, one or more reference lines 106 and 108, and one or more transistors 110 and 112, which are all coupled to a substrate 114. Substrate 114 may comprise, for example, silicon or other suitable semiconductive material. While conventional ROM cells can store only one of two possible values, system 100 can store one of many possible values using a combination of one of multiple reference level conductors that may be coupled to one of multiple bit level conductors.

A via layer may be disposed outwardly from substrate 114. The via layer may comprise, for example, silicon dioxide or other suitable insulating material, and may comprise one or more vias 116a, 118a, 120a, and 122a comprising a metal such as aluminum or other suitable conductive material. To simplify the drawing, the silicon dioxide is not shown in FIG. 1. A metal layer may be disposed outwardly from the via layer. The metal layer may comprise silicon dioxide or other suitable insulating material, and one or more interconnects 124a, 126a, 128a, 130a, 132a, 134a, and 136a, comprising a metal such as aluminum or other suitable conductive material. To simplify the drawing, the silicon dioxide is not shown in FIG. 1. Additional via and metal layers may be disposed outwardly, in an alternating manner, from the layers disposed proximate substrate 114. Interconnects and vias may form via stacks, for example, vias 120a–d and interconnects 130a–d form a via stack.

Bit line 102 comprises vias 116a–d and interconnects 124a–d. Vias 116a–d and interconnects 124a–d are coupled to each other in an alternating manner, as shown. Similarly, bit line 104 comprises vias 118a–d and interconnects 126a–d coupled to each other in an alternating manner, as shown. Bit level conductors 128a–d are coupled to a decoding circuit 180 by a bit line 140 and a bit line bus 141. Reference lines 106 and 108 comprise vias and interconnects coupled together in an alternating manner. Reference line 106 comprises vias 120a–d and interconnects 130a–d, and reference line 108 comprises vias 122a–d and interconnects 132a–d. Reference level conductor sets 142 and 144 comprise interconnects, or reference level conductors. Reference level conductor set 142 comprises reference level conductors 134a–d, and reference level conductor set 144 comprises reference level conductors 136a–d.

Transistors 110 and 112 are formed in an outer surface of substrate 114, as shown. Transistor 110 comprises a source region 150 and a drain region 152 formed in substrate 114. Source 150 and drain 152 may comprise, for example, a doped region of substrate 114, which may itself comprise a suitable semiconductor such as silicon, germanium, gallium arsenide, or other suitable material. Transistor 110 also comprises a gate 154 and a gate oxide layer 156 separating substrate 114 from gate 154. Gate 154 may comprise, for example, a doped polysilicon or other suitable conductive material, and oxide 156 may comprise silicon dioxide or other suitable material. Gate 154 controls the current flowing from source 150 to drain 152. System 100 also comprises a word line 158 coupled to gate 154, which is used to activate gate 154. Transistor 112 may be constructed in a similar manner as transistor 110. Transistor 112 may comprise a drain 162 and a source 160 formed in substrate 114. Transistor 112 may also comprise a gate 164, a gate oxide layer 166, and word line 158 formed and coupled as shown. Transistor 112 may comprise materials similar to those of transistor 110, or may comprise other suitable materials.

Reference line 106 is coupled to source 150 of transistor 110, and bit line 102 is coupled to drain 152 of transistor 110. Bit line 104 is coupled to drain 162 of transistor 112, and reference line 108 is coupled to source 160 of transistor 112.

To store an input value, system 100 encodes the input value by assigning, or coupling, a reference level conductor to a bit level conductor. That is, the input value is encoded by a combination of: a default or a reference value and a bit value, where the default value represents no coupling. Each of the reference level conductors 134a–d of reference level conductor set 142 has a unique reference value, for example, reference level conductors 134a, 134b, 134c, and 134d have voltage values $V_1$, $V_2$, $V_3$, and $V_4$, respectively. Other types of suitable reference values may be used. For example, each reference level conductor may have a unique current value. Alternatively, each reference level conductor may be associated with uniquely timed pulse of a voltage or current signal during which the reference level is activated relative to a reference time. Similarly, each bit level conductor 128a–d has a unique bit value, for example, bit level conductors 128a–d have bit values $b_0$–$b_4$, respectively.

One of the reference level conductors may be assigned to one of the bit level conductors. The system 100 is statically programmed when it is formed to store a value. The value is encoded by coupling a bit level conductor to a reference level conductor. Due to the multiplicity of bit and reference level conductors, a single system 100, acting as a single memory cell does not merely store one of two values as a conventional static cell, but rather can store one of many possible values. In this manner, a single cell constructed as shown can be representative of many data bits instead of the just one data bit per cell, as associated with conventional memory architecture.

According to the example shown, reference level conductor 134c with voltage value $V_3$, is coupled to and conducts voltage $V_3$ to reference line 106, which in turn transmits voltage $V_3$ to source 150. Gate 154 conducts voltage $V_3$ from source 150 to drain 152, which in turn conducts voltage $V_3$ to bit line 102. According to this embodiment, interconnect 124b is coupled to bit level conductor 128b with bit value $b_1$. Bit line 140 and bit line bus 141 conducts voltage $V_3$ to decoding circuit 180.

Bit line bus 141 comprises one line for each bit level conductor 128a–d, and is coupled to decoding circuit 180. Decoding circuit 180 comprises one analog to digital converter (ADC) for each line associated with a bit level conductor. ADCs 182, 184, 186, and 188 convert voltage values received from the bit level conductors 128a–d to digital data. ADCs 182–188 are coupled to decoder 190, which receives digital data from the ADCs and translates the data to a digital output.

Similarly, reference level conductors 136a, 136b, 136c, and 136d of reference level conductor set 144 may also have unique voltage values $V_5$, $V_6$, $V_7$, and $V_8$, respectively. Other suitable reference values, for example, current values and timed pulse values, may be used. The voltage values may be distinct from those of reference level conductors 134a–d of reference level conductor set 142, that is, $V_i \neq V_j$ for i, j=1,2, ... 8 where i≠j.

One of the reference level conductors may be assigned to one of the bit level conductors. According to this embodiment, reference level conductor 136a with voltage value $V_5$ is coupled to and conducts voltage value $V_5$ to reference line 108. Reference line 108 conducts voltage $V_5$ to source 160, which in turn conducts voltage $V_5$ to gate 164. Gate 164 conducts voltage $V_5$ to drain 162, which conducts the voltage value to bit line 104. According to this embodiment, interconnect 126c is coupled to and conducts voltage $V_5$ value to bit level conductor 128c with bit value $b_3$. The bit level conductor to which bit line 104 is coupled may be different from the bit level conductor to which bit line 102 is coupled. The voltage-bit level combination of voltage $V_5$ and bit value $b_2$ is conducted to decoding circuit 180, where it is translated to an equivalent digital code associated with the sensed combination of the voltage and bit values.

FIG. 2 is a flowchart demonstrating one embodiment of a method that may be used in accordance with the present invention. The method stores data as a combination of a voltage value and a bit value. To store data, one of many reference values may be assigned to one of many bit level values by using a transistor to couple the reference level conductor associated with the reference value to the bit level conductor associated with the bit value.

Specifically, the method begins at step 202, where reference lines 106 and 108 and reference level conductors 134*a–d* and 136*a–d* are provided. Reference lines 106 and 108 and reference level conductors 134*a–d* and 136*a–d* may be part of a multi-layer memory cell architecture such as that described with reference to FIG. 1. Reference line 106 may comprise interconnects 130*a–d* and vias 120*a–d* coupled together in an alternating manner. Reference line 106 may be coupled to source 150 of transistor 110. Reference level conductor set 142 may comprise reference level conductors 134*a–d*, which may comprise the interconnects of metal layers. Similarly, reference line 108 may comprise interconnects 132*a–d* and vias 122*a–d* coupled together in an alternating manner. Reference line 108 may be coupled to source 160 of transistor 112. Reference level conductor set 144 may comprise reference level conductors 136*a–d*.

At step 204, bit lines 102 and 104 and bit level conductors 128*a–d* are provided. Bit line 102 may comprise interconnects 124*a–d* and vias 116*a–d*, and bit line 104 may comprise interconnects 126*a–d* and vias 118*a–d*. Bit line 102 may be coupled to drain 152 of transistor 110, and bit line 104 may be coupled to drain 162 of transistor 112. Bit level conductor set 140 may comprise bit level conductors 128*a–d*. Bit level conductors 128*a–d* may be coupled to only one interconnect from either bit line 102 or 104, or not coupled at all and retain a default value.

At step 206, transistors 110 and 112 coupling reference lines 106 and 108 to bit lines 102 and 104, respectively, are provided. Transistor 110 is operable to conduct a voltage value from reference line 106 to bit line 102, and transistor 112 is operable to communicate a voltage value from reference line 108 to bit line 104. At step 208, unique reference values are assigned to reference level conductors 134*a–d* and 136*a–d*. Voltage values $V_1$–$V_4$ are assigned to reference level conductors 134*a–d*, respectively. Voltage values $V_5$–$V_8$ are assigned to reference level conductors 136*a–d*, respectively. No two reference level conductors are assigned the same reference value, that is, $V_i \neq V_j$, where i,j=1,2, . . . 8 and i≠j. Other suitable reference values may be used, for example, current values or timed pulse values.

At step 210, a value is encoded by assigning a reference value to a bit value, that is, the value is encoded as a combination of a reference value and a bit value. To describe the types of combinations possible with reference lines 106 and 108, assume that reference lines 106 and 108 have voltage values $\{V_1, V_2, \ldots, V_N, V_H\}$ and $\{V_{N+1}, \ldots, V_{2N}, V_H\}$, respectively, where $V_i \neq V_j$ for all i≠j, and $V_H$ is the null value indicating no assignment. Additionally, assume that the bit values are $\{b_0, b_1, \ldots, b_{M-1}\}$.

The combinations may be described as four groups of combinations. Group I includes assignments from reference line 106 to bit levels 128*a–d*, that is, one of $\{V_1, V_2, \ldots, V_N\}$ is assigned to one of $\{b_0, b_1, \ldots, b_{M-1}\}$, yielding N·M combinations. Group II includes assignments from reference line 108 to bit levels 128*a–d*, that is, one of $\{V_{N+1}, \ldots, V_{2N}\}$ is assigned to one of $\{b_0, b_1, \ldots, b_{M-1}\}$, again yielding N·M combinations.

Group III includes assignments from both references lines 106 and 108 to bit levels 128*a–d*. One of $\{V_1, V_2, \ldots, V_N\}$ is assigned to one of $\{b_0, b_1, \ldots, b_{M-1}\}$, and one of $\{V_{N+1}, \ldots, V_{2N}\}$ is assigned to one of $\{b_0, b_1, \ldots, b_{M-1}\}$, excluding the $b_i$ to which already reference line 106 is already assigned, yielding N·M[N·(M−1)] combinations. Group IV includes the null assignment, where no value from either reference line 106 or 108 is assigned to a bit level, yielding one combination. The total number of combinations is calculated by summing the number of combinations from the four groups, as shown in Equation (1):

$$\text{Total} = N \cdot M[N \cdot (M-1)] + N \cdot M + N \cdot M + 1 \tag{1}$$

$$= N \cdot M[N \cdot (M-1) + 2] + 1$$

Since N for reference levels 134*a–d* and 136*a–d* is four and M for bit levels 128*a–d* is four, the total number of combinations is 225.

The total number of combinations determines the number of bits that can be stored in a dual stacked via ROM cell such as the architecture described with reference to FIG. 1. The total number may be expressed as $2^q$, where q is the number of bits that can be stored. Thus, the number of bits that can be stored is given by the relation expressed in Equation (2):

$$q = \log_2(\text{total number of combinations}) \tag{2}$$

$$= \log_2(N \cdot M[N \cdot (M-1) + 2] + 1)$$

If N=M=4, then seven bits can be stored in the dual stacked via ROM cell. Note that conventional ROM cells can store only one of two values. The number of bits that may be stored for other values of N and M are shown in TABLE 1.

TABLE 1

| N = M | Combinations | $q_N$ bits |
|---|---|---|
| 2 | 17 | 4 |
| 3 | 73 | 6 |
| 4 | 225 | 7 |
| 5 | 551 | 9 |
| 6 | 1153 | 10 |
| 7 | 2157 | 11 |
| 8 | 3713 | 11 |
| 9 | 5995 | 12 |
| 10 | 9201 | 13 |
| 11 | 13553 | 13 |

Multiple reference lines may be coupled to a single bit line, yielding even more possible codes. When using multiple reference lines, current or time-based reference values may be used.

A dual stacked via ROM cell is estimated to have an area from two to four times the area of a conventional single bit ROM cell. A four-level stacked via ROM cell, however, can store seven bits while a single bit ROM cell can store only one bit. Hence, the area of the array needed to store one bit using the via ROM cell is 2/7 to 4/7 the area of the array using the conventional single bit ROM cell. There is an overhead associated with generating the reference voltage values and decoding the voltage values to digital values, but this overhead is very small when considering the space saved with an array of thousands to millions of cells.

To encode values, each value is assigned one of the possible $2^q$ bit combinations. According to this embodiment, the following encoding operation may be used to encode data; other suitable encoding operations, however, may be used. To simplify the encoding operation, assume N=M such that $2^q=N \cdot M[N \cdot (M-1)+2]+1=N^2(N^2-N+2)+1$. Also assume that the values to be stored are nonnegative and are expressed in binary q bit code $[X_{q-1}, X_{q-2}, \ldots, X_1, X_0]$. This encoding operation uses only combinations from Groups II and III; combinations from other groups, however, may be used.

To begin, define two pairs of indices to program left-hand side reference line 106 and right-hand side reference line 108:

(i,j) to determine programming for reference line 106, where i refers to a coupling between a reference level conductor and reference line 106, and j refers to a coupling between bit line 102 and a bit level conductor; and (h,k) to determine programming for reference line 108, where h refers to a coupling between a bit level conductor and bit line 104, and k refers to a coupling between reference line 108 and a reference level conductor.

Next, define two integers r and s. Integer r may be defined using Equation (3):

$$r=N \cdot j+i \qquad (3)$$

where $\epsilon$=member of or belongs to a set of values;

$r \epsilon [0, N^2]$, $i \epsilon [0, N-1]$, and $j \epsilon [0, N]$; and $j \epsilon [0, N-1]$, if bit level conductor $b_j$ is coupled to bit line 102;

j=N, if no bit level conductor is coupled to bit line 102; and $i \epsilon [0, N-1]$, if reference level conductor having reference value $Vi+_1$ is coupled to reference line 106.

Integer s may be defined using Equation (4):

$$s=h \cdot N+k \qquad (4)$$

where $s \epsilon [0, N^2-N-1]$, $h \epsilon [0, N-2]$, and $k \epsilon [0, N-1]$; and j=0, $h \epsilon [0, N-2]$, if bit level conductor $b_{h+1}$ is coupled to bit line 104;

j>0, $h \epsilon [0, j-1]$, if bit level conductor $b_h$ is coupled to bit line 104; and j>0, $h \epsilon [j, N-2]$, if bit level conductor $b_{h+1}$ is coupled to bit line 104.

Next, define the value X to be stored, as expressed in Equation (5):

$$X=r[N(N-1)]+s \qquad (5)$$

The values of i, j, k, and h that satisfy Equation (5) determines the programming of the cell.

At step 212, the reference level conductors associated with the value to be stored are coupled to reference lines 106 and 108. According to this embodiment, reference level conductor 134c, with voltage value $V_3$, is coupled to reference line 106, and reference level conductor 136a, with voltage value $V_5$, is coupled to reference line 108. Reference level conductor 134c may be coupled to interconnect 130c using metal programming, where a metal layer is used for coupling. Alternatively, reference level conductor 134c may be coupled to reference line 106 by via programming, where a via is used for coupling, or other suitable method. Similarly, reference level conductor 136a may be coupled to interconnect 132a using metal programming, via programming, or other suitable method.

At step 214, the bit level conductor associated with the value to be stored is coupled to the bit line. In this embodiment, interconnect 124b is coupled to bit level conductor b, and interconnect 126c is coupled to bit level conductor $b_2$ using metal programming, via programming, or other suitable method. The coupling methods used to couple the reference level conductors to reference lines and interconnects to bit level conductors need not be the same.

At step 216, gates 154 and 164 of transistors 110 and 112, respectively, are activated to allow voltage to flow from reference lines 106 and 108 to bit lines 102 and 104, respectively. According to this embodiment, voltage value $V_3$ is conducted from reference level conductor 134c through reference line 106, through transistor 110, through bit line 102 to bit level conductor $b_1$. Voltage $V_3$ is conducted through bit line bus 141 to decoding circuit 180 and then to ADC 184. Similarly, voltage $V_5$ is conducted from reference level conductor 136a through reference line 108, transistor 112, and bit line 104 to bit line bus 141. Voltage $V_5$ is transmitted through bit line bus 141 to decoding circuit 180 and then to ADC 186.

At step 218, data encoded as a voltage value is decoded to a digital output by translating the voltage distribution on the bit line bus 141 to a digital value. According to this embodiment, the following decoding operation is used to decode data encoded using the encoding operation previously described; other suitable operations, however, may be used. To simplify the explanation, assume that:

$$V_1 < V_2 < \ldots < V_N < V_{def} < V_{N+1} < \ldots < V_{2N}$$

where $V_{def}$ is a default voltage indicating an uncoupled bit line. Also, assume that the voltage values are equally spaced between $V_1$ and $V_{2N}$. A voltage value V conducted on the line of bit line bus 141 from bit level conductor $b_p$ is input into the ADC associated with the bit level conductor. According to this embodiment, $V_3$ is input into ADC 184, and voltage Vs is input into ADC 186. Each ADC outputs the following values $D_p$, $L_p$, $R_p$, and $U_p$, where p is a bit level conductor index, as described by Equations (6) (9):

Output $L_p$ describes whether reference line 106, the left hand side of the ROM, is coupled to one of reference level conductors 134a–d, and is expressed by Equation (6):

$$L_p = \begin{cases} 1 & \text{if } 0 < V < V_{def} \\ 0 & \text{otherwise} \end{cases} \qquad (6)$$

Output $R_p$ describes whether reference line 108, the right-hand side of the ROM, is coupled to one of the reference level conductors 136a–d, and is expressed by Equation (7):

$$R_p = \begin{cases} 1 & \text{if } V > V_{def} \\ 0 & \text{otherwise} \end{cases} \qquad (7)$$

Output $D_p$ indicates the reference level conductor of the input voltage V, and is expressed by Equation (8):

$$D_p = \begin{cases} i & \text{if } V = V_{i+1}, L_p = 1, \text{ and } R_p = 0 \\ k & \text{if } V = V_{k+1}, R_p = 0, \text{ and } L_p = 1 \end{cases} \qquad (8)$$

Output $U_p$ describes the null value, and is expressed by Equation (9):

$$U_p = \{1 \text{ if } V=V_{def} \qquad (9)$$

0 otherwise

The outputs of the ADCs 182–188 are then transmitted to decoder 190, which translates the ADC outputs to a final output. According to this embodiment, decoder 190 uses the following operation to decode the voltage values; other suitable operations, however, may be used. Recall that in the encoding operation previously discussed, the stored value X was encoded using the relationship described by Equation (5):

$$X = r(N(N-1)) + s \quad (5)$$

where $r = N \cdot j + i$ and $s = h \cdot N + k$.

Decoder 190 calculates the values for h, i, j, and k using Equations (10)–(13):

$$i = \sum_{w=0}^{N} L_w D_w \quad (10)$$

$$j = \sum_{w=0}^{N} w L_w \quad (11)$$

$$k = \sum_{w=0}^{N} R_w D_w \quad (12)$$

$$h = \sum_{w=0}^{N} H_w R_w \quad (13)$$

where $$H_w = \begin{cases} p+1 & \text{if } j = 0 \text{ and } V > 0 \text{ or } j \in [j, N-2] \text{ and } V > 0 \\ p & \text{if } j \in [1, j-1] \text{ and } V > 0 \end{cases}$$

Once decoder 190 determines values i, j, k, and h, decoder 190 calculates the stored value X, which it outputs as digital data, and the method terminates.

FIGS. 3A an 3A are planar views of exemplary layouts identifying stacks, and gates, and lines. FIG. 3A illustrates reference lines 106 and 108 and bit lines 102 and 104. Gates 154 and 164, word line 158, and bit line bus 141 are also illustrated. FIG. 3B illustrates reference lines 106 and 108 and bit lines 102 and 104. Gates 154 and 164, word line 158, and bit line bus 141 are also illustrated.

A technical advantage of the present invention is that it uses up to all available or additional conductive layers of a semiconductor process to store data. The use of up to all or available or additional layers results in the storage of a large amount of information in a relatively small area. Another technical advantage of the present invention is that the programming of the semiconductor occurs at the later stages of production. By programming at later stages, the present invention allows for faster production of semiconductors from the time of the customer's programming request. Another technical advantage of the present invention is that it enhances the speed of operation by using layers that provide low resistivity connections to the bit level. Consequently, the present invention allows for the fast production of semiconductors that are able to store a large amount of information.

Although an embodiment of the invention and its advantages are described in detail, a person skilled in the art could make various alternations, additions, and omissions without departing from the spirit and scope of the present invention as defined by the appended claims.

What is claimed is:

1. A system for storing data, the system comprising:
   two or more bit level conductors, each bit level conductor having a bit value;
   one or more transistors; and
   one or more reference level conductors, each reference conductor having a reference value, wherein a selected reference level conductor is operable to transmit a selected reference value to one of the transistors, the transistor is operable to transmit the selected reference value to a selected bit level conductor having a selected bit value, and the bit level conductors, the transistors, and the reference level conductors are operable to store data by encoding data as a combination comprising the selected bit value and the selected reference value.

2. The system of claim 1, wherein no bit level conductor receives reference values from more than one reference level conductor.

3. The system of claim 1, further comprising two or more layers wherein each layer comprises no more than one bit level conductor.

4. The system of claim 1, wherein at least one the reference value is a voltage value.

5. The system of claim 1, wherein at least one the reference value is a current value.

6. The system of claim 1, wherein at least one the reference value is a timed pulse value.

7. The system of claim 1, further comprising a via, wherein the selected reference level conductor is operable to transmit the selected reference value to one of the transistors and the transistor is operable to transmit the selected reference value to the selected bit level conductor using the via.

8. The system of claim 1, further comprising a metal layer, wherein the selected reference level conductor is operable to transmit the selected reference value to one of the transistors and the transistor is operable to transmit the selected reference value to the selected bit level conductor using the metal layer.

9. The system of claim 1, further comprising:
   a bit line bus coupled to the bit level conductors; and
   a decoding circuit coupled to the bit line bus and operable to decode data encoded as the combination of the selected bit value and the selected reference value by translating the combination to a digital output.

10. The system of claim 1, wherein the transistor comprises a field effect transistor.

11. The system of claim 1, wherein one of the bit level conductors receives none of the reference values and retains a default value.

12. A method for storing data, the method comprising:
    providing two or more bit level conductors, each bit level conductor having a bit value, one or more transistors, and one or more reference level conductors, each reference level conductor having a reference value;
    selecting a selected bit value of a selected bit level conductor and a selected reference value of a selected reference level conductor;
    encoding data by translating the data from a digital form to a combination comprising the selected bit value and the selected reference value;
    storing data by coupling the selected bit level conductor to the selected reference level conductor, wherein the selected reference level conductor is operable to transmit the selected reference value to one of the transistors, and the transistor is operable to transmit the selected reference value to the selected bit level conductor.

13. The method of claim 12, wherein no bit level conductor receives reference values from more than one reference level conductor.

14. The method of claim 12, wherein at least one the reference value is a voltage value.

15. The method of claim 12, wherein at least one the reference value is a current value.

16. The method of claim 12, wherein at least one the reference value is a timed pulse value.

17. The method of claim 12, wherein the step of storing comprises transmitting the reference value using a via.

18. The method of claim 12, wherein the step of storing comprises transmitting the reference value using a metal layer.

19. The method of claim 12, further comprising transmitting the reference value from the bit level conductor to a decoding circuit using a bit line bus coupled to the bit level conductors and the decoding circuit.

20. The method of claim 12, further comprising decoding the stored data by translating the combination comprising the selected bit value and the selected reference value to the digital form using a decoding circuit coupled to the bit level conductors.

21. The method of claim 12, wherein one of the bit level conductors receives none of the reference values and retains a default value.

22. A system for storing data, the system comprising:

a substrate;

two or more layers outwardly disposed from the substrate;

two or more bit level conductors disposed outwardly from the substrate, wherein each bit level conductor has a bit value and each layer outwardly disposed from the substrate comprises no more than one bit level conductor;

one or more field effect transistors disposed outwardly from the substrate;

one or more sets of reference level conductors, each set comprising two or more reference level conductors, each reference level having a voltage value;

a bit line bus coupled to the bit level conductors; and a decoding circuit coupled to the bit line bus, wherein a selected reference level conductor of one of the sets is operable to transmit a selected voltage value to one of the transistors, the transistor is operable to transmit the selected voltage value to a selected bit level conductor having a selected bit value using a via, no bit level conductor receives voltage values from more than one reference level conductor, and the bit level conductor set, the transistors, and the reference level conductor sets are operable to store data by encoding data as a combination comprising the selected bit value and the selected voltage value, the decoding circuit operable to decode data encoded as the combination of the selected bit value and the selected reference value by translating the combination to a digital output.

* * * * *